(12) United States Patent
Kawasaki et al.

(10) Patent No.: US 12,400,820 B2
(45) Date of Patent: Aug. 26, 2025

(54) FIELD EMISSION ELECTRON SOURCE, ELECTRON OPTICAL DEVICE, AND MANUFACTURING METHOD

(71) Applicant: Hitachi, Ltd., Tokyo (JP)

(72) Inventors: Takeshi Kawasaki, Tokyo (JP); Tetsuya Akashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 18/937,805

(22) Filed: Nov. 5, 2024

(65) Prior Publication Data

US 2025/0174422 A1  May 29, 2025

(30) Foreign Application Priority Data

Nov. 27, 2023  (JP) ................. 2023-199925

(51) Int. Cl.
*H01J 1/304* (2006.01)
*H01J 37/073* (2006.01)

(52) U.S. Cl.
CPC .......... *H01J 1/3044* (2013.01); *H01J 37/073* (2013.01); *H01J 2201/30415* (2013.01); *H01J 2201/30449* (2013.01)

(58) Field of Classification Search
CPC .................. H01J 1/3044; H01J 37/073; H01J 2201/30415; H01J 2201/30449
See application file for complete search history.

(56) References Cited

FOREIGN PATENT DOCUMENTS

JP  2006-134638 A  5/2006

OTHER PUBLICATIONS

Ueda et al. (Year: 2009).*
Yasuda et al. (Year: 2007).*
Matsunaga et al. (Year: 2018).*
Fukuta et al. (Year: 2020).*

* cited by examiner

*Primary Examiner* — Mary Ellen Bowman
(74) *Attorney, Agent, or Firm* — Crowell & Moring LLP

(57) ABSTRACT

In a field emission electron source used in an electron optical device, a tip distal end portion of the field emission electron source includes a needle-shaped shunt having a diameter that is reduced toward a distal end, a substantially spherical protrusion formed at the distal end of the shunt, a coating that covers the shunt and the substantially spherical protrusion, and an opening through which a part of the substantially spherical protrusion is exposed, the shunt and the substantially spherical protrusion are formed by using first metal as a material, the coating is formed by using second metal as a material, and the second metal has a work function larger than a work function of the first metal.

6 Claims, 9 Drawing Sheets

FIELD EMISSION ELECTRON SOURCE, ELECTRON OPTICAL DEVICE, AND MANUFACTURING METHOD

CROSS-REFERENCE TO RELATED APPLICATION

The present application claims priority from Japanese application JP2023-199925, filed on Nov. 27, 2023, the content of which is hereby incorporated by reference into this application.

BACKGROUND OF THE INVENTION

1. Field of the Invention

The present invention relates to a field emission electron source, an electron optical device, and a manufacturing method.

2. Description of the Related Art

A field emission electron source is used for an electron optical device such as a transmission electron microscope or a scanning electron microscope.

The field emission electron source is an electron source that emits electrons by applying a voltage between a sharpened needle-shaped electrode (referred to as a tip below) and an opposing electrode (extraction electrode) to increase an electric field at the distal end of the tip to about $5 \times 10^9$ [V/m].

The field emission electron source has characteristics of a high luminance (amount of current emitted from a unit area into a unit solid angle) and a narrow energy width of emitted electrons, and is widely used for applications such as high-resolution observation and electron beam interference measurement. As a material of the field emission electron source, single crystal of W (tungsten) (310) orientation or W (111) orientation is usually used.

Currently, an electron microscope is required to further improve the luminance of a field emission electron source for the purpose of high-resolution observation, short-time exposure, observation throughput improvement, electron beam interference measurement, and the like. In order to improve the luminance of the field emission electron source, a method in which a light source diameter of the field emission (more precisely, a virtual light source diameter because the light source is an imaginary light source) is reduced up to the atomic order to increase the luminance is known.

Regarding a technique for reducing the light source diameter, for example, JP 2006-134638 A discloses "an electron beam source for an electron optical device formed from a microstructure in which a countable number of atoms of second metal different from first metal are arranged to be heating-repaired by covering a distal end surface of a first metal base having a needle shape whose the distal end is sharpened".

SUMMARY OF THE INVENTION

A conventional field emission electron source such as the electron beam source for an electron optical device disclosed in JP 2006-134638 A has the following problems, and thus is not practical.

It is difficult to form a light source diameter in an atomic order with high reproducibility.

It is difficult to obtain a stable emission current due to collision of ions generated by ionization of a gas around the tip.

In a case where a probe current of several [nA] to several tens [nA] necessary for a practical device is intended to be obtained, the current density in an emission region becomes very high, the light source diameter increases by the orbit displacement due to the Coulomb interaction to decrease the luminance, and the energy width of the emitted electrons also increases.

The present invention has been made in view of the above points, and an object of the present invention is to realize a practical field emission electron source with a high luminance.

The present application includes a plurality of means for solving at least some of the above problems, but examples thereof are as follows.

In order to solve the above problems, according to an aspect of the present invention, there is provided a field emission electron source used in an electron optical device, in which a tip distal end portion of the field emission electron source includes a needle-shaped shunt having a diameter that is reduced toward a distal end, a substantially spherical protrusion formed at the distal end of the shunt, a coating that covers the shunt and the substantially spherical protrusion, and an opening through which a part of the substantially spherical protrusion is exposed, the shunt and the substantially spherical protrusion are formed by using first metal as a material, the coating is formed by using second metal as a material, and the second metal has a work function larger than a work function of the first metal.

According to the present invention, it is possible to realize a practical field emission electron source with a high luminance.

Objects, configurations, and advantageous effects other than those described above will be clarified by the descriptions of the following embodiments.

DESCRIPTION OF THE PREFERRED EMBODIMENTS

Figure 1:
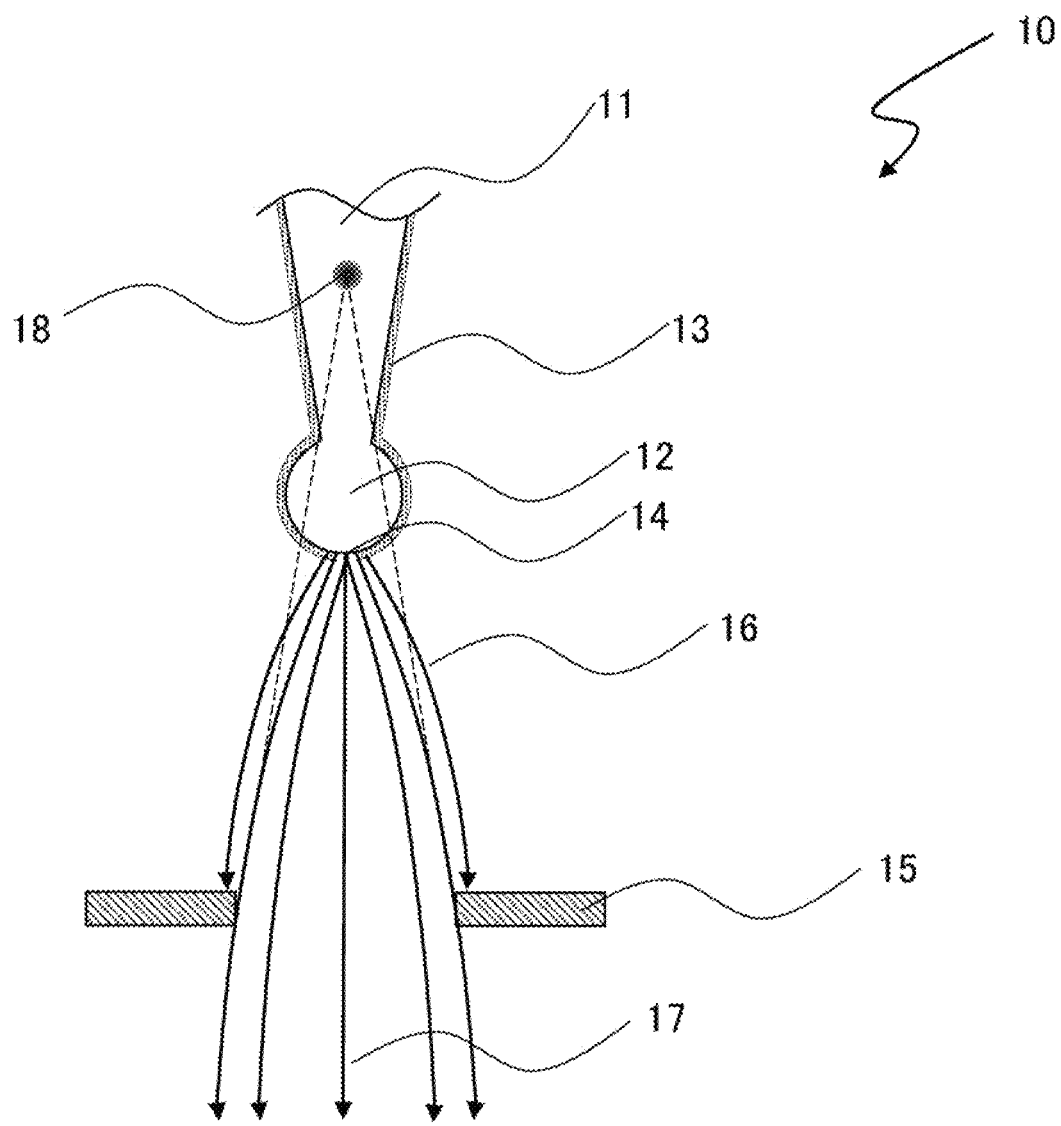
FIG. 1 is a view illustrating a configuration example of a tip distal end portion of a field emission electron source according to an embodiment of the present invention.

Hereinafter, an embodiment of the present invention will be described with reference to the drawings. The embodiment is for describing the present invention, and are omitted and simplified as appropriate for clarity of description. The present invention can be implemented in various other forms. Unless otherwise specified, each constituent element may be singular or plural. Positions, sizes, shapes, ranges, and the like of the constituent elements illustrated in the drawings are provided to facilitate understanding of the invention and may not represent actual positions, sizes, shapes, ranges, and the like. In all the drawings for describing the embodiment, the same members are denoted by the same reference signs in principle, and repetitive description thereof will be omitted. In the following embodiment, the constituent elements (including elements, steps, and the like) are not necessarily essential unless otherwise specified or considered to be obviously essential in principle. In addition, when the terms "formed from A", "formed by A", "having A", and "including A" are used, other elements are not excluded unless specified that this means only the element. Similarly, in the following embodiment, regarding the shapes, the positional relationships, and the like of the components and the like, the shapes and the like that are substantially approximate or similar to the shapes and the like are included, unless otherwise specified or considered to be obviously not in principle. It is assumed that "acquisition" includes at least generation, calculation, and reception of a subject from the outside as a specific example.

<Configuration Example of Tip Distal End Portion 100 of Conventional Field Emission Electron Source>

A field emission electron source according to an embodiment of the present invention is used for an electron optical device such as a transmission electron microscope or a scanning electron microscope. First, before describing a tip distal end portion 10 (FIG. 1) of the field emission electron source according to the embodiment of the present invention, a tip distal end portion 100 of a conventional field emission electron source will be described.

Figure 9:
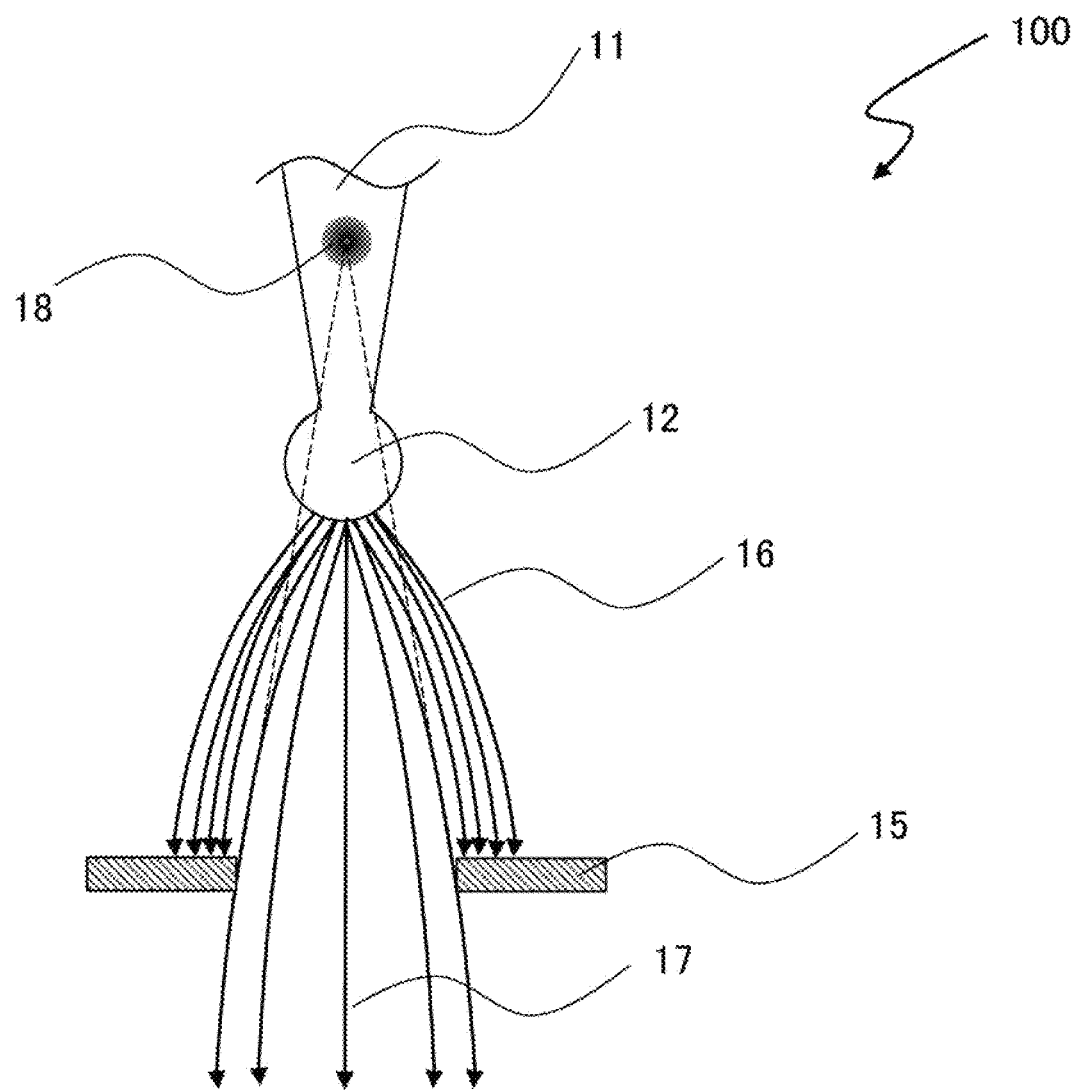
FIG. 9 is a view illustrating a configuration example of a tip distal end portion of a conventional field emission electron source.

FIG. 9 illustrates a configuration example of the tip distal end portion 100 of the conventional field emission electron source. The tip distal end portion 100 is formed by using, for example, tungsten (W) as a material, and includes a needle-shaped shunt 11 having a diameter that is reduced toward a distal end (lower side in the drawing) and a substantially spherical protrusion 12 at the distal end of the shunt 11.

The shunt 11 is formed by electropolishing a rod-shaped material. The substantially spherical protrusion 12 is provided for the purpose of exposing a clean surface to the distal end of the shunt 11 and preventing breaking of the distal end portion of the shunt 11 due to static electricity or the like. In a case where the material of the shunt 11 is W, the substantially spherical protrusion 12 is formed by repeating flushing at a temperature of about 1800 [° C.].

A diaphragm 15 having the same potential as an extraction electrode is disposed between the tip distal end portion 100 and the extraction electrode (not illustrated).

In the field emission electron source, electrons are emitted from the surface of the substantially spherical protrusion 12 by applying a voltage between the tip distal end portion 100 and the extraction electrode. A virtual light source 18 exists at a position obtained by extending, in the reverse direction, the trajectory of electrons (referred to as a probe current below) 17 that have passed through an opening of the diaphragm 15 among electrons (referred to as a total emission current below) 16 emitted from the surface of the substantially spherical protrusion 12.

Like the tip distal end portion 100, in the tip distal end portion 100 of the conventional field emission electron source that is not a fine electron source in an atomic order (the curvature radius of the virtual light source 18 is, for example, about 100 to 200 [nm]), the total emission current 16 having a solid angle of about 1 [sr] is emitted from the virtual light source 18, and the probe current 17 that has passed through the diaphragm 15 is used for scanning a sample surface and the like. The probe current 17 is about $1/1000$ of the total emission current 16.

That is, portions that is the most of the total emission current 16, other than the probe current 17 are cut off by the diaphragm 15 and are not actually used. Since the Coulomb interaction between the electrons emitted from the field emission electron source occurs not only between the electrons forming the probe current 17 but also between the electrons other than the probe current 17, it is desirable to reduce the portions of the total emission current 16 other than the probe current 17.

Therefore, in the tip distal end portion 10 (FIG. 1) of the field emission electron source according to the embodiment of the present invention, the portions of the total emission current 16 other than the probe current 17 are reduced.

<Configuration Example of Tip Distal End Portion 10 of Field Emission Electron Source According to Embodiment of Present Invention>

FIG. 1 illustrates a configuration example of the tip distal end portion 10 of the field emission electron source according to the embodiment of the present invention. Common portions between the tip distal end portion 10 and the conventional tip distal end portion 100 (FIG. 9) are denoted by the same reference signs, and description thereof will be appropriately omitted.

The tip distal end portion 10 includes a shunt 11 having a diameter that is reduced toward a tip end (lower side in the drawing) and a substantially spherical protrusion 12 at the tip end of the shunt 11.

As a material of the tip distal end portion 10, for example, W (310) orientation is adopted. The material is not limited to the W (310) orientation, and W (111) orientation, other metals, or the like may be adopted. The W (310) orientation corresponds to first metal in the present invention.

The shunt 11 is reduced in diameter in a needle shape by electropolishing the distal end of rod-shaped single crystal having a diameter of about 0.1 [mm] of the W (310) orientation. The substantially spherical protrusion 12 is formed in a spherical shape or a droplet shape having a curvature radius of about 100 to 200 [nm].

Figure 2:
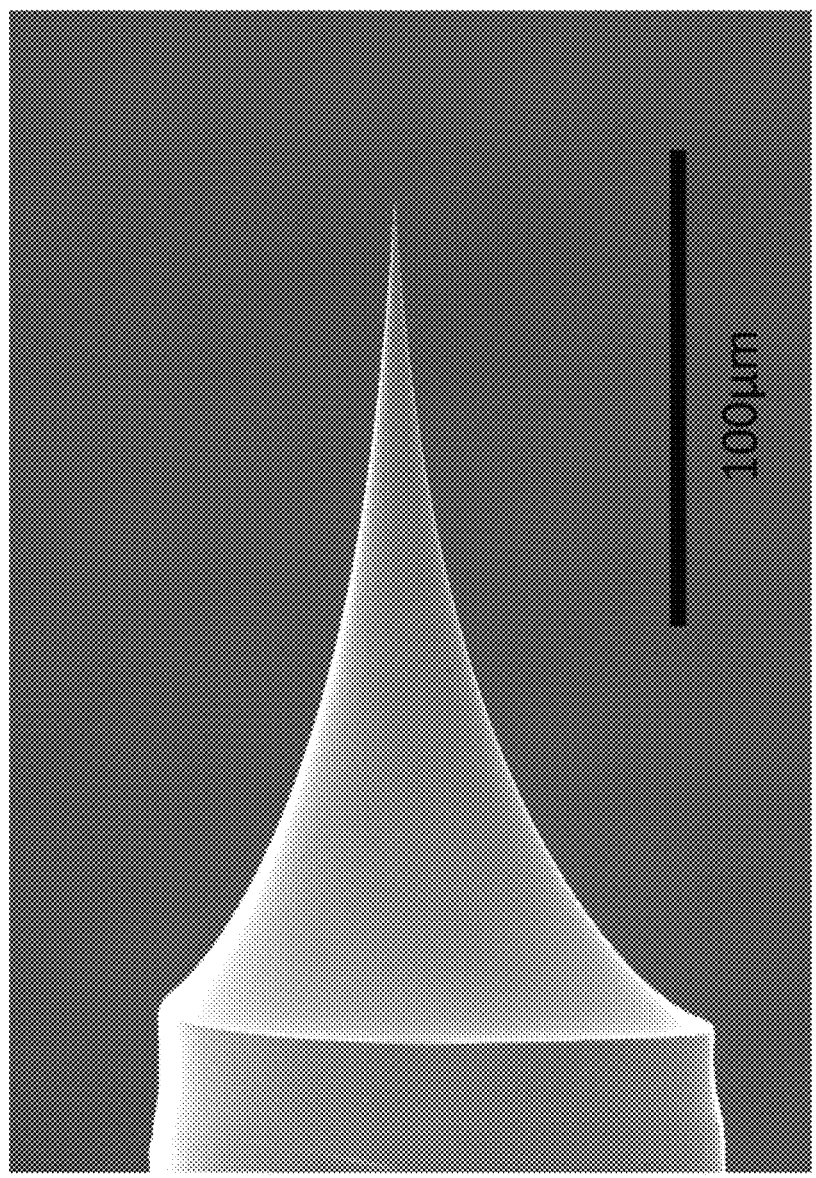
FIG. 2 is a view illustrating an example of a multiplied scanning electron microscope image of the tip distal end portion.

FIG. 2 illustrates an example of a multiplied scanning electron microscope image of the tip distal end portion 10 in which the W (310) orientation is adopted as the material. Since the size of the substantially spherical protrusion 12 is much smaller than the distal end of the shunt 11, it is not possible to visually recognize the substantially spherical protrusion in FIG. 2.

Return to FIG. 1. A coating 13 having a thickness of several [nm] is formed on the shunt 11 and the substantially spherical protrusion 12 in the tip distal end portion 10. The coating 13 is formed by a chemical vapor deposition method using a material (for example, Os (osmium)) having a work function higher than work functions of the materials of the shunt 11 and the substantially spherical protrusion 12 (for example, W (310) orientation).

The work function of a W (310) plane which is the material of the shunt 11 and the substantially spherical protrusion 12 is 4.3 [eV]. The work function of Os that is the material of the coating 13 is 5.2 [eV]. Os is metal having a melting point of 3045 [° C.], and can form an amorphous coating with less uniform graininess. Thus, Os is used for coating or the like provided in an electron optical device that requires heat resistance and does not desire contamination. Os corresponds to second metal of the present invention. As the material of the coating 13, Pt (platinum) or Pd (palladium) may be adopted in addition to Os.

In the coating 13 that covers the substantially spherical protrusion 12, the coating 13 on an axis (referred to as an emission axis below) that passes through the virtual light source 18 and the center of the diaphragm 15 is removed, and thus an opening 14 is provided, and the material (for example, W) of the substantially spherical protrusion 12 is exposed. The opening 14 has a radius of about 1 [nm], for example.

<Regarding Step of Providing Opening 14 in Substantially Spherical Protrusion 12>

Figure 3:
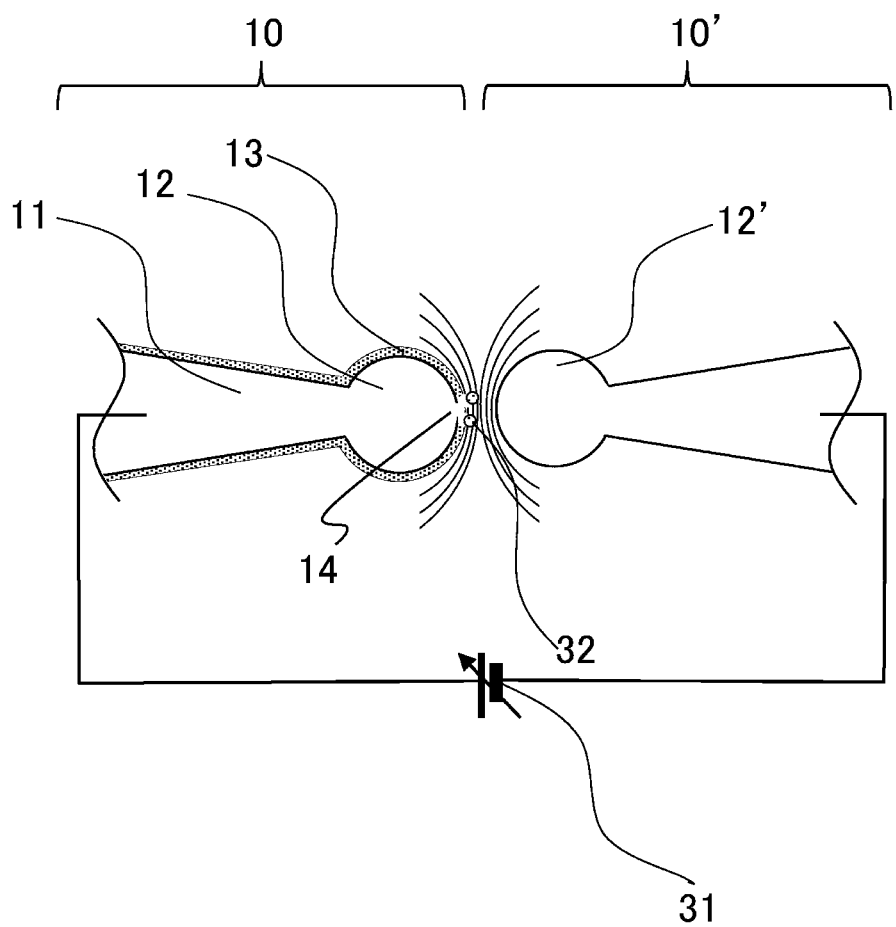
FIG. 3 is a view for explaining a step of providing an opening.

FIG. 3 is a view for explaining a step of providing the opening 14 in the substantially spherical protrusion 12.

First, without providing the opening 14, the tip distal end portion 10 in which the shunt 11 and the substantially spherical protrusion 12 are entirely covered by the coating 13 and a tip distal end portion 10' before being entirely covered by the coating 13 are prepared.

Then, the tip distal end portion 10 and the tip distal end portion 10' are disposed to face each other in vacuum or in an imaging gas such as He (helium) or Ne (neon). A substantially spherical protrusion 12' of the tip distal end portion 10' is driven as a probe by a piezo drive mechanism (not illustrated), thereby constituting a scanning tunnel microscope.

Then, the surface of the substantially spherical protrusion 12 of the tip distal end portion 10 is scanned to specify the W (310) surface. In a circular region having a radius that is about 1 [nm] in the specified W (310) plane, a high voltage is applied by a power supply 31 between the tip distal end portion 10 and the tip distal end portion 10' to generate a strong electric field of several tens [V/nm]. In the electric field, by causing electric field evaporation on the surface on the emission axis of the substantially spherical protrusion 12 of the tip distal end portion 10, atoms of the coating 13 are ionized and sequentially removed to form the opening 14. It is sufficient that a field emission microscope or a field ion microscope is used to check whether or not a desired crystal plane as the opening 14 is obtained.

<Field Emission Pattern of Electrons Emitted from Tip Distal End Portion 10>

Figure 4B:
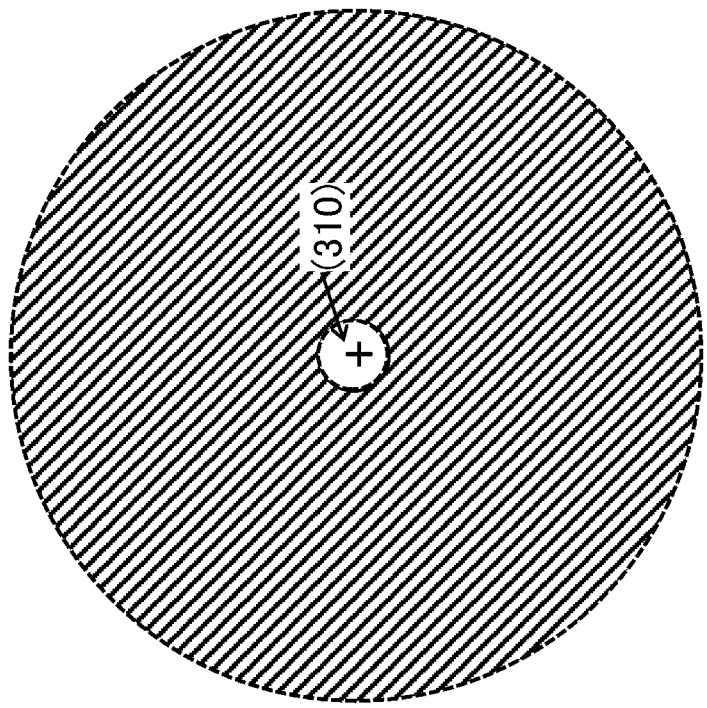
FIG. 4B is a schematic view illustrating an example of a field emission pattern corresponding to the tip distal end portion according to the present embodiment.
Figure 4A:
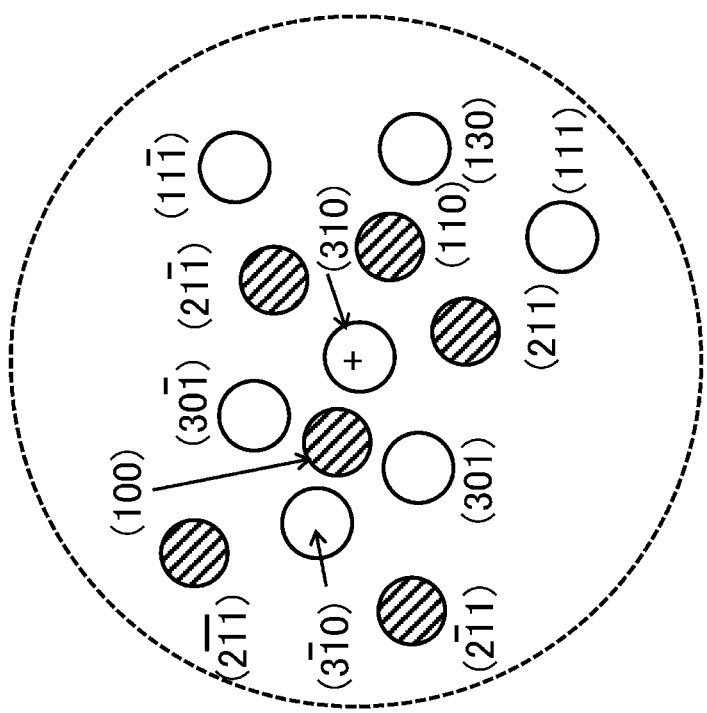
FIG. 4A is a schematic view illustrating an example of a field emission pattern in a case where a coating and the opening are not provided.

FIG. 4 illustrates a schematic view of a field emission pattern of electrons emitted from the tip distal end portion 10 of the W (310) orientation. FIG. 4A illustrates an example of a case where the substantially spherical protrusion 12 is not covered by the coating 13. FIG. 4B illustrates an example of a case where the substantially spherical protrusion 12 is covered by the coating 13 and the opening 14 is provided (in the case of the present embodiment).

In FIGS. 4A and 4B, a circle with a white inside schematically represents an orientation in which the work function is low and an electron emission amount is large, and a circle with a diagonal line inside schematically represents a dark orientation in which the work function is high and the electron emission amount is small. In the case of FIG. 4A, since the brightness in the (310) orientation overlaps in the actual field emission pattern, each circle does not appear to be an independent circle, and the boundary of each orientation is not clear.

On the other hand, in the case of FIG. 4B corresponding to the present embodiment, since each orientation other than the W (310) plane on the emission axis is covered by the coating 13, the total emission current is hardly emitted. As a result, only the emission from the W (310) plane on the emission axis can be brightened.

In a case where the W (310) plane on the emission axis is contaminated by gas adsorption or the like and the probe current decreases, if weak flushing (short-time energization heating) of about 1000 [° C.] is performed, the adsorbed gas can be removed and the probe current can be brought back to the original state. Os used as the material of the coating 13 can withstand heating of at least about 1000 [° C.].

<Regarding Simulation Result of Emitted Electron Characteristics>

Next, FIGS. 5 to 8 illustrate results obtained by performing Monte Carlo simulation of emission electron characteristics in consideration of the Coulomb interaction in a case where the substantially spherical protrusion 12 is not covered by the coating 13 (indicated in the drawings by broken lines. This case is referred to as a case of W below) and a case where the substantially spherical protrusion 12 is covered by the coating 13 and the opening 14 is provided (indicated in the drawings by solid lines. This case is referred to as a case of Os below.)

The simulation was performed under conditions that the radius of the substantially spherical protrusion 12 is 130 [nm], the work function of the W (310) plane is 4.3 [eV], the work function of Os is 5.2 [eV], and the radius of the opening 14 is a circular region of 1 [nm].

The horizontal axes in FIGS. 5 to 8 are common and indicate a probe current Ip [nA].

Figure 5:
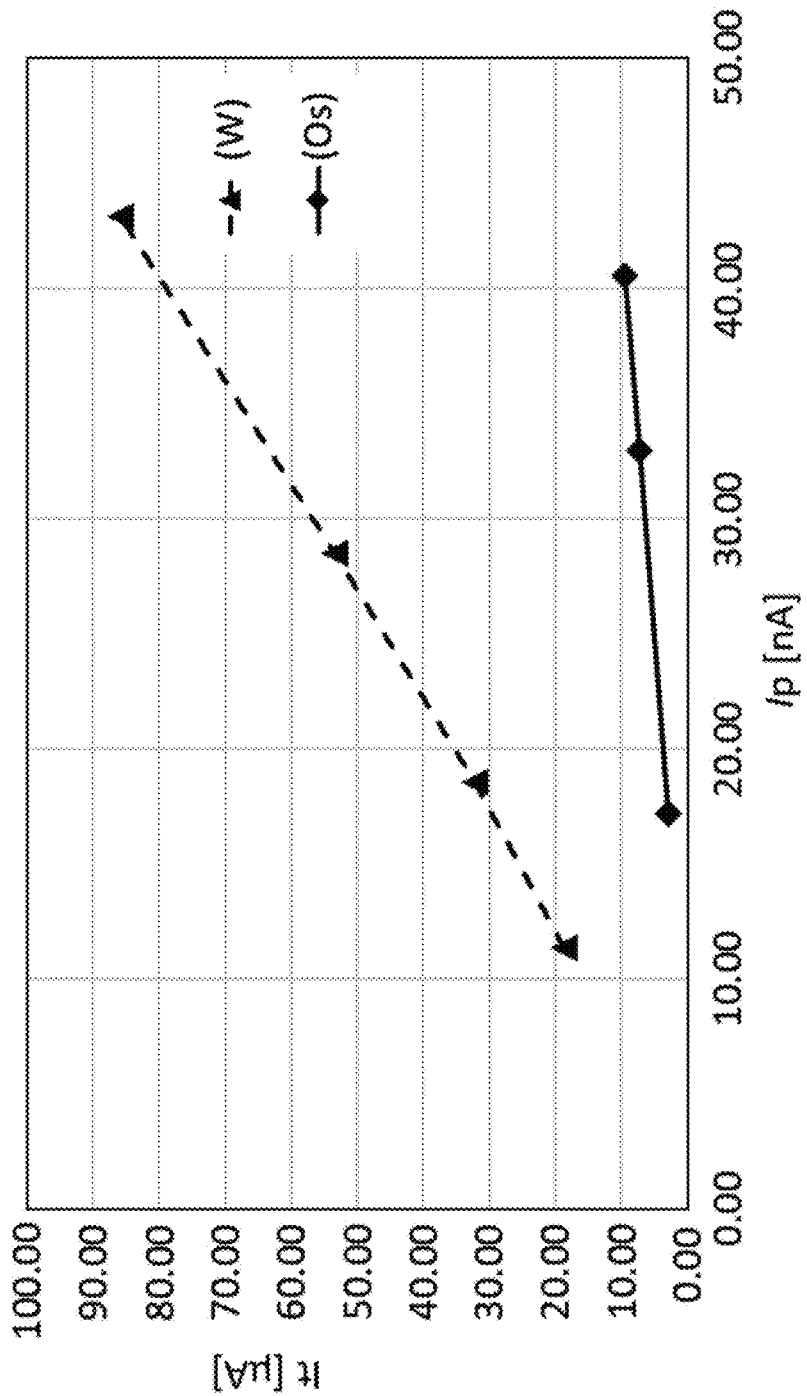
FIG. 5 is a view illustrating a simulation result of a total emission current with respect to a probe current.

The vertical axis in FIG. 5 indicates a total emission current It [μA]. As can be seen from FIG. 5, the total emission current It when the same probe current Ip is intended to be obtained is about 1/10 of that for the case of Os in the case of W.

Figure 6:
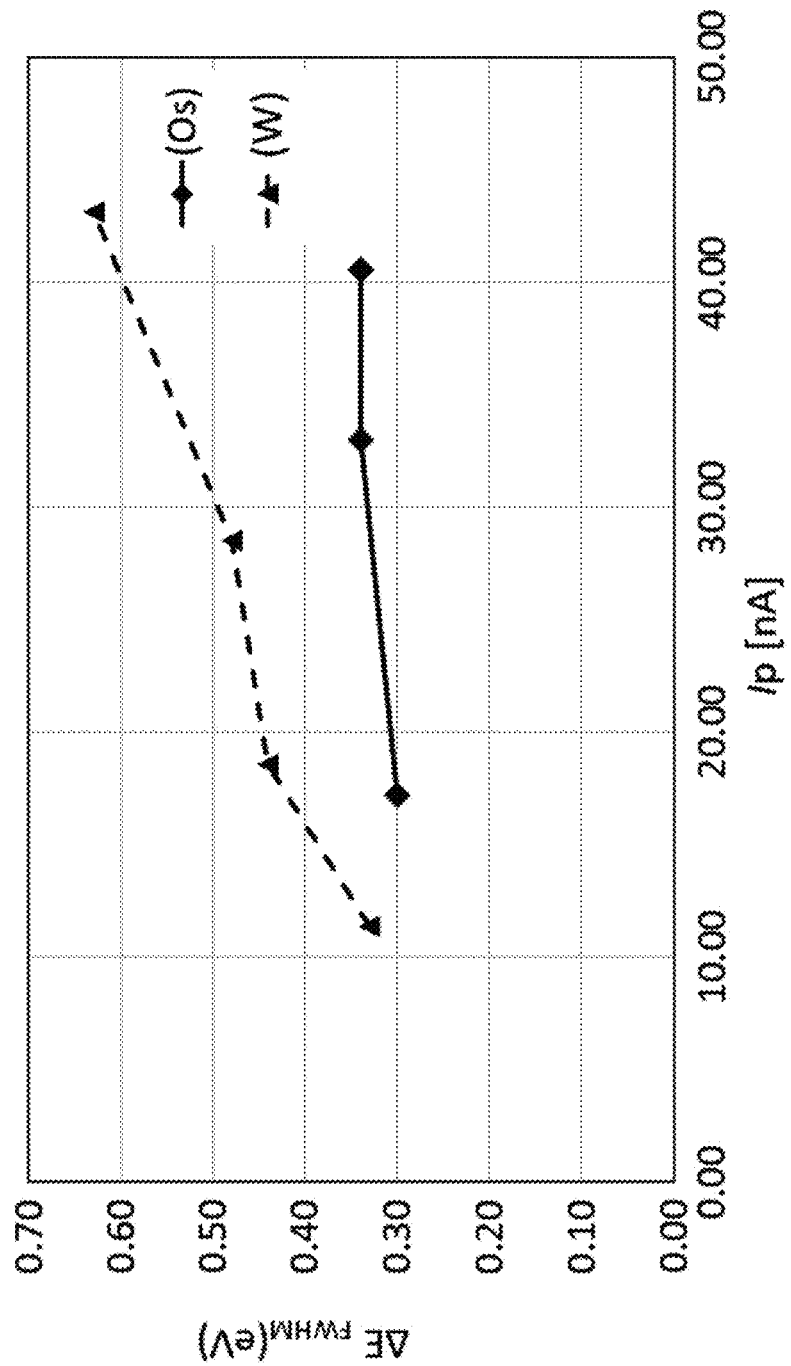
FIG. 6 is a view illustrating a simulation result of an energy width with respect to the probe current.

The vertical axis in FIG. 6 indicates an energy width ΔE [eV] that is a result of an influence on an emission axis direction in the Coulomb interaction between electrons in the probe current and electrons in the total emission current. As can be seen from FIG. 6, the energy width ΔE when the same probe current Ip is intended to be obtained decreases in the case of Os as compared with the case of W. For example, the energy width ΔE when the Coulomb interaction is not considered is 0.28 [eV] when calculated by the Fowler-Nordheim theory of field emission. Thus, it can be seen that the energy width ΔE is 0.34 [eV] and does not increase much even when the probe current Ip of 40 [nA] is obtained in the case of Os.

Figure 7:
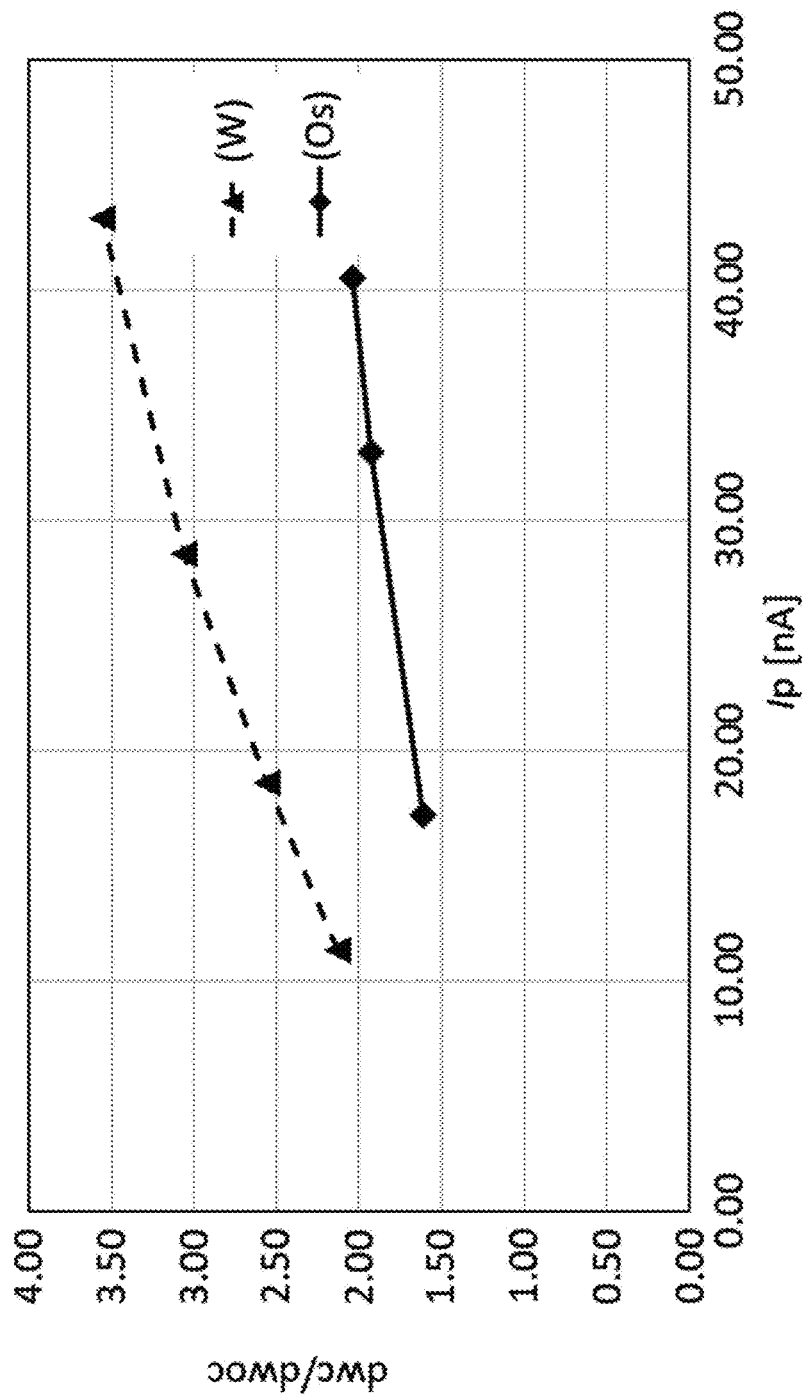
FIG. 7 is a view illustrating simulation results of a ratio of a virtual light source diameter when the Coulomb interaction with respect to the probe current is considered and when the Coulomb interaction is not considered.

The vertical axis in FIG. 7 indicates a ratio between the diameter dwc of the virtual light source 18 when the Coulomb interaction is considered and the diameter dwoc of the virtual light source 18 when the Coulomb interaction is not considered. It is known that the influence of the Coulomb interaction between electrons in a direction perpendicular to the emission axis appears in an increase in the diameter of the virtual light source 18. As can be seen from FIG. 7, it can be seen that the diameter increase ratio of the virtual light source 18 due to the Coulomb interaction is suppressed to about 4/7 for the case of W, in the case of Os.

Figure 8:
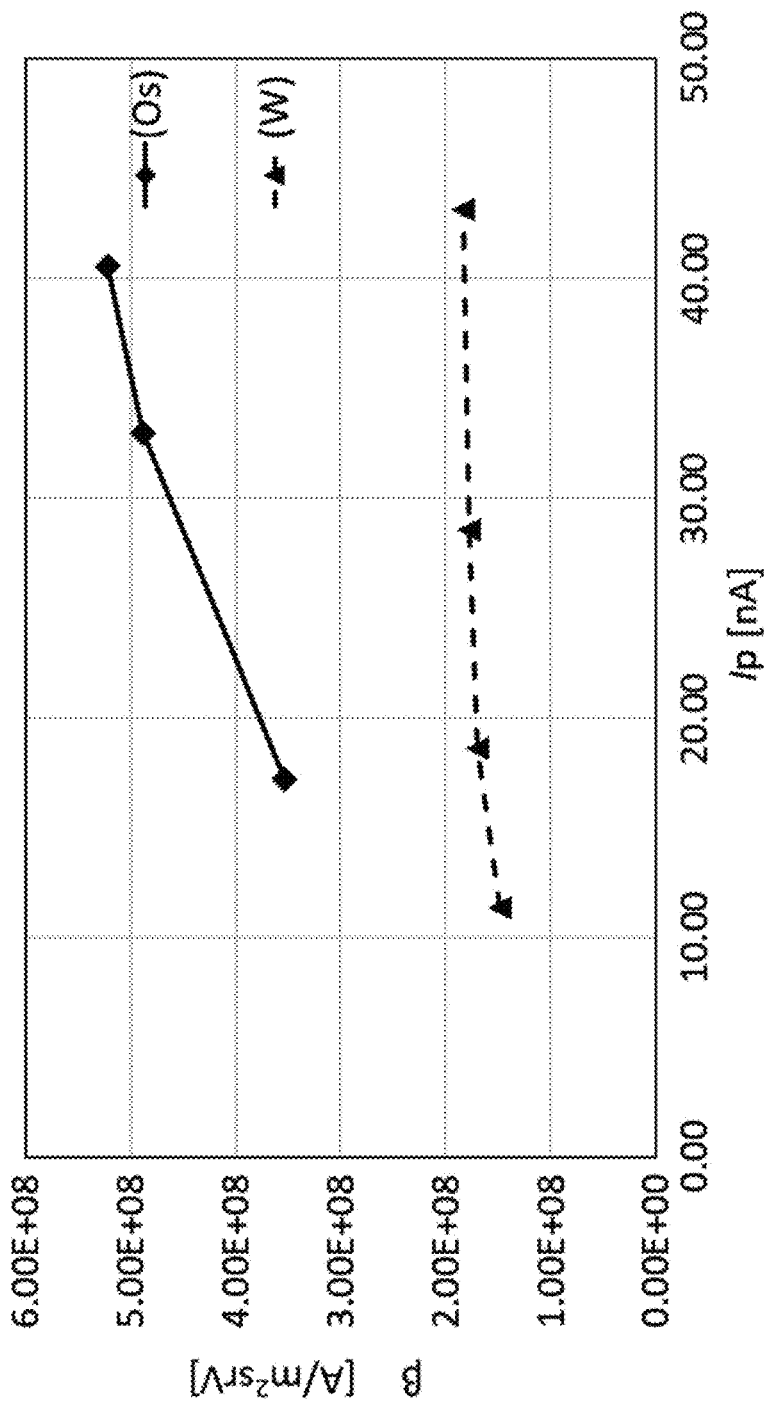
FIG. 8 is a view illustrating a simulation result of a slack period with respect to the probe current.

The vertical axis in FIG. 8 indicates the converted luminance β. The position of the virtual light source 18 in the case of Os is substantially the same as that in the case of W. As can be seen from FIG. 8, the converted luminance β in the case of Os is about three times as large as that in the case of W. In addition, in the case of W, the converted luminance β reaches a peak as the probe current Ip increases, whereas in the case of Os, the converted luminance β keeps increasing as the probe current Ip increases. This is because in the case of W, the increase rate of the diameter of the virtual light source 18 is larger than the increase rate on the larger side of the probe current Ip.

SUMMARY

As compared with the tip distal end portion 100 (FIG. 9), the tip distal end portion 10 according to the present embodiment can reduce the portions of the total emission current other than the probe current in the portion of the tip distal end portion 10 covered by the substance having a high work function (coating 13) in a state where the amount of the probe current is maintained in a case where the same electric field intensity is applied.

As a result, the Coulomb interaction between the electrons in the probe current and the electrons other than the probe current in the peripheral total emission current is greatly reduced, and the orbital displacement is also reduced. Therefore, an increase in the diameter and the energy width of the virtual light source 18 is suppressed, and it is possible to emit an electron beam having a high luminance, a large current, and a low energy width.

In addition, an electron impact desorption gas emitted when the total emission current collides with the diaphragm in the electron optical device or the inner wall of the electron optical device is reduced, and the frequency at which cations generated by ionization of the gas collide with the electron source is reduced. Thus, it is possible to maintain stable electron emission.

The present invention is not limited to the embodiment described above, and various modifications can be made. For example, the above-described embodiment is described in detail in order to explain the present invention in an easy-to-understand manner, and the above embodiment is not necessarily limited to a case including all the described configurations. In addition, a portion of the configuration of one embodiment can be replaced with or added to a configuration of another embodiment.

What is claimed is:

1. A field emission electron source used in an electron optical device, wherein
a tip distal end portion of the field emission electron source includes
a needle-shaped shunt having a diameter that is reduced toward a distal end,
a substantially spherical protrusion formed at the distal end of the shunt,
a coating that covers the shunt and the substantially spherical protrusion, and
an opening through which a part of the substantially spherical protrusion is exposed,
the shunt and the substantially spherical protrusion are formed by using first metal as a material,
the coating is formed by using second metal as a material, and
the second metal has a work function larger than a work function of the first metal.

2. The field emission electron source according to claim 1, wherein
the opening is formed on an emission axis of a virtual light source.

3. The field emission electron source according to claim 1, wherein
the first metal is tungsten, and
the second metal is osmium, platinum, or palladium.

4. An electron optical device using a field emission electron source, wherein
a tip distal end portion of the field emission electron source includes
a needle-shaped shunt having a diameter that is reduced toward a distal end,
a substantially spherical protrusion formed at the distal end of the shunt,
a coating that covers the shunt and the substantially spherical protrusion, and
an opening through which a part of the substantially spherical protrusion is exposed,
the shunt and the substantially spherical protrusion are formed by using first metal as a material,
the coating is formed by using second metal as a material, and
the second metal has a work function larger than a work function of the first metal.

5. A manufacturing method for a tip distal end portion of a field emission electron source used in an electron optical device, the manufacturing method comprising:
preparing a tip of the field emission electron source, the tip including a shunt that uses first metal as a material and has a needle shape having a diameter that is reduced toward a distal end, and a substantially spherical protrusion formed at the distal end of the shunt;
covering the shunt and the substantially spherical protrusion by a coating using, as a material, second metal having a work function larger than a work function of the first metal;
disposing the substantially spherical protrusion covered by the coating and another substantially spherical protrusion that is not covered by the coating to face each other; and
forming an opening that partially exposes the substantially spherical protrusion, in a manner that a voltage is applied between the substantially spherical protrusion and the other substantially spherical protrusion to cause electric field evaporation on the coating that covers the substantially spherical protrusion in an electric field.

6. The field emission electron source according to claim 1, wherein the substantially spherical protrusion has a larger diameter than an end of the shunt from which the substantially spherical protrusion projects.

* * * * *